United States Patent
Chen

(10) Patent No.: US 10,784,242 B2
(45) Date of Patent: Sep. 22, 2020

(54) DISPLAY SUBSTRATE AND FABRICATION METHOD THEREOF, DISPLAY PANEL AND DISPLAY DEVICE

(71) Applicant: BOE Technology Group Co., Ltd., Beijing (CN)

(72) Inventor: Yuju Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/445,777

(22) Filed: Jun. 19, 2019

(65) Prior Publication Data

US 2019/0393202 A1 Dec. 26, 2019

(30) Foreign Application Priority Data

Jun. 26, 2018 (CN) .......................... 2018 1 0672284

(51) Int. Cl.

| | |
|---|---|
| *H01L 25/16* | (2006.01) |
| *H01L 33/08* | (2010.01) |
| *H01L 33/00* | (2010.01) |
| *H01L 33/06* | (2010.01) |
| *H01L 33/32* | (2010.01) |

(52) U.S. Cl.
CPC ........ *H01L 25/167* (2013.01); *H01L 33/0093* (2020.05); *H01L 33/08* (2013.01); *H01L 33/06* (2013.01); *H01L 33/32* (2013.01)

(58) Field of Classification Search
CPC ... H01L 25/167; H01L 33/0093; H01L 33/08; H01L 33/06; H01L 33/32

USPC .......................................................... 257/13
See application file for complete search history.

(56) References Cited

U.S. PATENT DOCUMENTS

| | | | |
|---|---|---|---|
| 9,153,545 B2 * | 10/2015 | Yamamoto | ............... F21K 9/27 |
| 9,477,019 B2 | 10/2016 | Li et al. | |
| 10,622,411 B2 * | 4/2020 | Park | .................... H01L 51/5004 |
| 2013/0021561 A1 | 1/2013 | Ann | |
| 2015/0286091 A1 | 10/2015 | Zhang et al. | |
| 2016/0033836 A1 | 2/2016 | Chen | |

FOREIGN PATENT DOCUMENTS

| | | |
|---|---|---|
| CN | 102386200 A | 3/2012 |
| CN | 102707510 A | 10/2012 |
| CN | 103760730 A | 4/2014 |

(Continued)

OTHER PUBLICATIONS

Office Action dated Sep. 3, 2019 issued in corresponding in Chinese Application No. 201710774145.0.

(Continued)

*Primary Examiner* — Tu-Tu V Ho
(74) *Attorney, Agent, or Firm* — Nath, Goldberg & Meyer; Joshua B. Goldberg

(57) ABSTRACT

The present disclosure provides display substrate and a fabrication method thereof, a display panel and a display device. The display substrate has a plurality of pixel regions, and includes an anode, a light-emitting layer and a cathode in each pixel region. In each pixel region, the light-emitting layer includes a plurality of light-emitting units spaced apart from each other, both the anode and the cathode are conductive layers each having an integral structure, and the plurality of light-emitting units are connected to the anode and the cathode, respectively.

20 Claims, 8 Drawing Sheets

(56) References Cited

FOREIGN PATENT DOCUMENTS

| CN | 103913888 A | 7/2014 |
|---|---|---|
| CN | 106684098 A | 5/2017 |
| CN | 107731864 A | 2/2018 |

OTHER PUBLICATIONS

First Office Action dated Mar. 16, 2020 corresponding to Chinese application No. 201810672284.7.

* cited by examiner

DISPLAY SUBSTRATE AND FABRICATION METHOD THEREOF, DISPLAY PANEL AND DISPLAY DEVICE

CROSS-REFERENCE TO RELATED APPLICATION

This application claims the benefit of priority to Chinese Patent Application No. 201810672284.7 filed on Jun. 26, 2018, the contents of which are incorporated herein in their entirety by reference.

TECHNICAL FIELD

The present disclosure relates to display technology, and particularly relates to a display substrate and a fabrication method thereof, a display panel and a display device.

BACKGROUND

Micro Light-Emitting Diode (referred to as LED) technology, i.e., LED miniaturization and LED matrixing technologies, particularly refers to integrating a micro-sized LED array having a high density on one chip. At present, the commonly used LEDs include GaN-based LEDs, which realize blue light emission, improve chromatogram, have received extensive attention in the field of color display and illumination, and have increasingly wide market prospect.

SUMMARY

In an aspect, the present disclosure provides a method of fabricating a display substrate, the display substrate having a plurality of pixel regions, the method including: providing a first substrate; and forming, in each pixel region, an anode, a light-emitting layer and a cathode on the first substrate. In at least one pixel region, the light-emitting layer includes a plurality of light-emitting units spaced apart from each other, both the anode and the cathode are conductive layers each having an integral structure, and the plurality of light-emitting units are connected to the anode and the cathode, respectively.

In some embodiments, forming, in each pixel region, the anode, the light-emitting layer and the cathode on the first substrate includes: forming the anode on the first substrate; forming the light-emitting layer on the second substrate; forming the light-emitting layer in at least one pixel region into the plurality of light-emitting units spaced apart from each other; bonding a side of the first substrate on which the anode is formed to a side of the second substrate on which the light-emitting layer is formed; removing the second substrate; and forming the cathode on a side of the light-emitting layer away from the first substrate.

In some embodiments, the method further includes, prior to forming the cathode on the side of the light-emitting layer away from the first substrate: forming an insulating layer on the side of the light-emitting layer away from the first substrate, wherein the insulating layer includes a via hole, and the cathode is connected to the light-emitting unit through the via hole; and performing wet etching by using the insulating layer as a mask, to remove the anode in a poorly-bonded region.

In some embodiments, forming the light-emitting layer in at least one pixel region into the plurality of light-emitting units spaced apart from each other includes splitting the light-emitting layer into the plurality of light-emitting units spaced apart from each other by a coupled plasma etching process.

In some embodiments, forming the light-emitting layer on the second substrate includes: forming a second conductivity type semiconductor layer on the second substrate; forming a multiple quantum well layer on a side of the second conductivity type semiconductor layer away from the second substrate; forming a first conductivity type semiconductor layer on a side of the multiple quantum well layer away from the second substrate; forming an ohmic contact layer on a side of the first conductivity type semiconductor layer away from the second substrate; forming a diffusion barrier layer on a side of the ohmic contact layer away from the second substrate; forming a reflective layer on a side of the diffusion barrier layer away from the second substrate; and forming an adhesion layer on a side of the reflective layer away from the second substrate In some embodiments, bonding the side of the first substrate on which the anode is formed to the side of the second substrate on which the light-emitting layer is formed includes: by using one of a flip chip bonding apparatus or a wafer bonding apparatus, bonding, at a stress of 1 kN to 50 kN, the side of the first substrate on which the anode is formed to the side of the second substrate on which the light-emitting layer is formed, under a temperature lower than 300 degrees Celsius In some embodiments, removing the second substrate includes: thinning the second substrate using a mixed indicator, such that a thickness of the second substrate is less than or equal to 100 microns; and removing the thinned second substrate In some embodiments, the method further includes, prior to forming the anode on the first substrate: forming a thin film transistor on the first substrate.

In some embodiments, the method further includes, subsequent to forming the cathode, forming a color filter on a side of the cathode away from the first substrate.

In another aspect, the present disclosure further provides a display substrate having a plurality of pixel regions, and includes an anode, a light-emitting layer and a cathode in each pixel region. In at least one pixel region, the light-emitting layer includes a plurality of light-emitting units spaced apart from each other, both the anode and the cathode are conductive layers each having an integral structure, and the plurality of light-emitting units are connected to the anode and the cathode, respectively.

In some embodiments, the display substrate further includes: a substrate, wherein the anode, the light-emitting layer and the cathode are sequentially on the substrate; and an insulating layer on a side of the light-emitting layer away from the anode. The cathode is on a side of the insulating layer away from the light-emitting layer, and the cathode is connected to the light emitting unit through a via hole in the insulating layer.

In some embodiments, an orthographic projection of the via hole on the substrate is within an orthographic projection of a corresponding light-emitting unit on the substrate.

In some embodiments, the insulating layer is made of silicon oxide, silicon nitride or a photoresist.

In some embodiments, the light-emitting unit includes: a metal layer, a first conductivity type semiconductor layer, a multiple quantum well layer and a second conductivity type semiconductor layer; the metal layer is on a side of the anode away from the substrate; the first conductivity type semiconductor layer is on a side of the metal layer away from the anode; the multiple quantum well layer is on a side of the first conductivity type semiconductor layer away from the metal layer; and the second conductivity type semiconductor layer is on a side of the multiple quantum well layer away from the first conductivity type semiconductor layer.

In some embodiments, the metal layer includes: an ohmic contact layer, a diffusion barrier layer, a reflective layer, and an adhesion layer; the adhesion layer is on a side of the anode away from the substrate; the reflective layer is on a side of the adhesion layer away from the anode; the diffusion barrier layer is on a side of the reflective layer away from the adhesion layer; and the ohmic contact layer is on a side of the diffusion barrier layer away from the reflective layer.

In some embodiments, a shape of the anode is one of a mesh shape or a planar shape.

In some embodiments, a shape of the cathode is one of a mesh shape or a planar shape.

In some embodiments, the display substrate further includes a thin film transistor between the substrate and the anode.

In another aspect, the present disclosure further provides a display panel, including a display substrate according to the present disclosure.

In another aspect, the present disclosure further provides a display device, including a display panel according to the present disclosure.

Other features and advantages of the present disclosure will be set forth in the following description, partly be apparent from the description, or be understood by implementing the present disclosure. The objects and other advantages of the present disclosure can be realized and obtained by the structure particularly pointed out in the description, claims and drawings.

BRIEF DESCRIPTION OF THE DRAWINGS

The accompanying drawings, which serve to provide a further understanding of the technical solutions of the present disclosure and constitute a part of this specification, are used for explaining the present disclosure together with the embodiments of the present disclosure, rather than limiting the present disclosure.

DETAILED DESCRIPTION

In order to make objects, technical solutions and advantages of the present disclosure more clear, the embodiments of the present disclosure will be described in detail below with reference to the accompanying drawings. It should be noted that the embodiments in the present disclosure and the features in the embodiments can be arbitrarily combined with each other without conflict.

Furthermore, although logical sequences are shown in the flow chart, the steps shown or described may be performed in a different order than the order described herein in some cases.

Unless otherwise defined, technical or scientific terms used in the embodiments of the present disclosure should have the same meaning as commonly understood by one of ordinary skill in the art to which the present disclosure belongs. The terms such as "first", "second" and the like used in the embodiments of the present disclosure do not indicate any order, quantity, or importance, but are merely used to distinguish different components. The term such as "include", "comprise", or the like means that an element or object in front of the term encompasses element(s) and object(s) listed behind the term, and their equivalents, without excluding other element(s) or object(s). The term such as "connect", "couple" or the like is not limited to physical or mechanical connection, but may include electrical connection, whether direct or indirect. The terms such as "upper", "lower", "left", "right", and the like are only used to indicate relative positional relationships, and when the absolute position of the object described changes, the relative positional relationship may also change accordingly.

As used herein, a pixel region refers to a light-emitting region of a sub-pixel, such as a region of an organic light-emitting diode display panel corresponding to a light-emitting layer. In an embodiment, a pixel may include a number of separate light-emitting regions corresponding to a number of sub-pixels in the pixel. In one embodiment, the pixel region is a light-emitting region of a red sub-pixel. In one embodiment, the pixel region is a light-emitting region of a green sub-pixel. In one embodiment, the pixel region is a light-emitting region of a blue sub-pixel. In one embodiment, the pixel region is a light-emitting region of a white sub-pixel.

Figure 1:
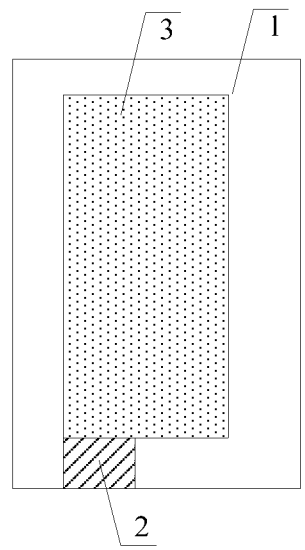
FIG. 1 is a plan view of one pixel region of a conventional display substrate.

FIG. 1 is a plan view of one pixel region of a conventional display substrate. The display substrate includes a plurality of pixel regions. In each of the pixel regions 1, as shown in FIG. 1, the display substrate includes an anode 2 and a light-emitting layer 3, and the light-emitting layer in each of the pixel regions has a planar structure.

According to the study by the inventors, if the anode or the light-emitting layer corresponding to the sub-pixel has local dirt or dust, the anode and the light-emitting layer are poorly bonded, thereby causing the entire sub-pixel to be unlit, which reduces the yield and display effect of the display panel.

Embodiments of the present disclosure provide a display substrate and a method of fabricating a display substrate, a display panel, and a display device that substantially obviate one or more of the problems due to the limitations and disadvantages of the related art.

Figure 2:
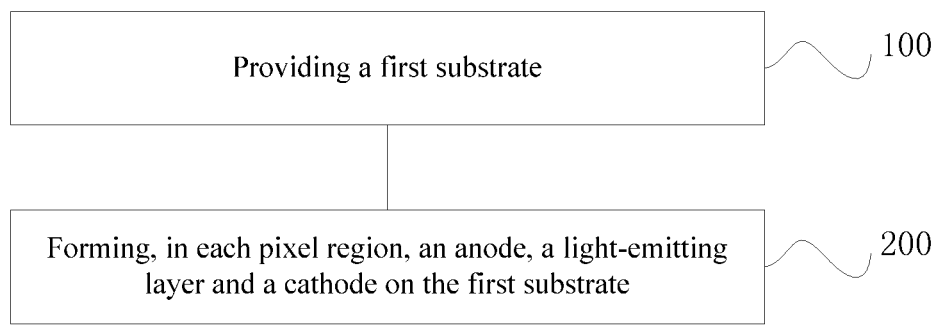
FIG. 2 is a flow chart of a method of fabricating a display substrate according to an embodiment of the present disclosure.

FIG. 2 is a flow chart of a method of fabricating a display substrate according to an embodiment of the present disclosure. As shown in FIG. 2, the method of fabricating a display substrate provided by the embodiment of the present disclosure may include step 100 and step 200.

At step 100, a first substrate is provided.

In the embodiment of the present disclosure, the display substrate includes a plurality of pixel regions.

In some embodiments, the first substrate includes: a glass substrate or a quartz substrate.

At step 200, an anode, a light-emitting layer, and a cathode are formed on the first substrate in each of the pixel regions.

According to the embodiment of the present disclosure, in each of the pixel regions, the light-emitting layer includes a plurality of light-emitting units spaced apart from each other, and each of the anode and the cathode is a conductive layer having an integral structure, and the light-emitting units are respectively connected to the anode and the cathode.

It should be noted that "integral structure" as used herein refers to a structure that does not include portions that are disconnected from each other.

In some embodiments, before the anode is formed on the first substrate in each of the pixel regions, the method for fabricating the display substrate further includes: forming a thin film transistor on the first substrate.

In some embodiments, a gate electrode, a gate insulating layer, an active layer, an interlayer dielectric layer, source and drain electrodes, and a passivation layer are sequentially formed on a glass substrate as the first substrate. In some embodiments, an active layer, a gate insulating layer, a gate electrode, an interlayer insulating layer, source and drain electrodes, and a passivation layer are sequentially formed on a glass substrate as the first substrate. The structure of the thin film transistor is not particularly limited in the embodiments of the present disclosure.

In some embodiments, the gate electrode has a thickness of 200 nm, the gate insulating layer has a thickness of 150 nm, the active layer has a thickness of 40 nm, the source and drain electrodes have a thickness of 200 nm, and the passivation layer has a thickness of 300 nm.

In some embodiments, the anode is made of a metal or an alloy, and may have a single-layer structure or a multi-layer structure. For example, the anode may have a three-layer structure of titanium/aluminum/titanium (Ti/Al/Ti). The material and structure of the anode are not particularly limited in the embodiments of the present disclosure.

In some embodiments, the anode has a thickness of 400 nm. The shape of the anode may be a mesh or a plane, and is not limited in the embodiments of the present disclosure.

In some embodiments, the cathode is made of a metal or an alloy, and may have a single-layer structure or a multi-layer structure. The material and structure of the cathode are not particularly limited in the embodiments of the present disclosure. The shape of the cathode may be a mesh or a plane, and is not limited in the embodiments of the present disclosure.

The method of fabricating a display substrate according to an embodiment of the present disclosure includes: providing a first substrate; and forming, in each pixel region, an anode, a light-emitting layer, and a cathode on the first substrate. In each pixel region, the light-emitting layer includes a plurality of light-emitting units spaced apart from each other, the anode and the cathode are both conductive layers each having an integral structure, and the light-emitting units are respectively connected to the anode and the cathode. In the method according to the present disclosure, the light-emitting layer is formed to include a plurality of light-emitting units spaced apart from each other, so that when the anode or the light-emitting layer corresponding to the sub-pixel is locally dirty or dusty, the well-bonded light-emitting units among the plurality of light-emitting units still emit light, thereby avoiding the problem that the entire sub-pixel is unlit due to the fact that the anode or the light-emitting layer corresponding to the sub-pixel is locally dirty or dusty, and thus improving the yield and display effect of the display panel.

In some embodiments, step 200 includes: forming the anode on the first substrate; forming the light-emitting layer on a second substrate; forming the light-emitting layer in each pixel region into a plurality of light-emitting units spaced apart from each other; bonding a side of the first substrate on which the anode is formed to a side of the second substrate on which the light-emitting layer is formed; removing the second substrate; and forming a cathode on a side of the light-emitting layer away from the first substrate.

In some embodiments, the anode may include sub-electrodes that are interconnected.

In some embodiments, before the cathode is formed on a side of the light-emitting layer away from the first substrate, the step 200 further includes: forming an insulating layer on a side of the light-emitting layer away from the first substrate and between adjacent two light-emitting units, the insulating layer including a via hole, the cathode being connected to the light-emitting unit through the via hole in the insulating layer; and performing wet etching by using the insulating layer as a mask, to remove the anode in the poorly-bonded region.

In some embodiments, the via holes of the insulating layer correspond to sub-electrodes of the anode. Here, the term "correspond" means that an orthographic projection of the via hole on the first substrate at least partially overlaps with an orthographic projection of a respective sub-electrode on the first substrate. In some embodiments, the orthographic projection of the via hole on the first substrate and the orthographic projection of the respective sub-electrode on the first substrate may be formed to coincide with each other.

In some embodiments, the second substrate is a silicon substrate.

The via hole exposes only a portion of the light-emitting unit, that is, the size of the via hole is smaller than the size of the light-emitting unit. In some embodiments, the orthographic projection of the light-emitting unit on the first substrate covers the orthographic projection of the via hole on the first substrate.

In some embodiments, the insulating layer is made of a photoresist, silicon oxide or silicon nitride, and the insulating layer has a thickness of 3 micron.

It should be noted that the insulating layer can be used in etching the anode before forming the cathode, to eliminate the portion of the anode that is poorly bonded to the light-emitting unit, thereby avoiding direct contact between the anode and the cathode to cause a short circuit.

In some embodiments, after the anode is formed on the first substrate, nickel/indium having a thickness of 500 nm may be deposited as an adhesion layer for bonding with the light-emitting layer on a side of the anode away from the first substrate.

In some embodiments, forming the light-emitting layer on the second substrate includes: forming an N-type semiconductor layer on the second substrate; forming a multiple quantum well layer on a side of the N-type semiconductor layer away from the second substrate; forming a P-type semiconductor layer on a side of the multiple quantum well layer away from the second substrate; forming an ohmic contact layer on a side of the P-type semiconductor layer away from the second substrate; forming a diffusion barrier layer on a side of the ohmic contact layer away from the second substrate; forming a reflective layer on a side of the diffusion barrier layer away from the second substrate; and forming an adhesion layer on a side of the reflective layer away from the second substrate.

In some embodiments, the N-type semiconductor layer is a Si-doped GaN, for example, with silane as a dopant. The dopant is not limited in embodiments of the present disclosure, as long as the dopant includes the material of Si.

In some embodiments, the multiple quantum well layer is made of InGaN/GaN (indium gallium nitride/gallium nitride). The multiple quantum well layer made of InGaN/GaN has remarkable characteristics such as high efficiency, environmental protection, energy conservation, long life, and the like.

In some embodiments, the P-type semiconductor layer is Mg-doped GaN, for example, with magnesocene as a dopant. The dopant is not limited in embodiments of the present disclosure, as long as the dopant includes the material of Mg.

In some embodiments, the ohmic contact layer is made of Ni/Au with a thickness of 5 nm/5 nm, respectively.

In some embodiments, the diffusion barrier layer is used for avoiding current spreading, and the diffusion barrier layer is made of titanium (Ti) and has a thickness of 200 nm.

In some embodiments, the reflective layer is used for reflecting light, and the reflective layer is made of silver (Ag) and has a thickness of 200 nm.

In some embodiments, the adhesion layer is used for bonding the anode with the light-emitting layer, is made of indium or tin and has a thickness of 500 nm.

In some embodiments, bonding a side of the first substrate on which the anode is formed to a side of the second substrate on which the light-emitting layer is formed includes: by using a flip chip bonding apparatus or a wafer bonding apparatus, bonding, at a stress of 1 kN to 50 kN, the side of the first substrate on which the anode is formed to the side of the second substrate on which the light-emitting layer is formed, under a temperature lower than 300 degrees Celsius.

In the embodiments of the present disclosure, bonding at the stress of 1 kN to 50 kN under the temperature less than 300 degrees Celsius can ensure that the adhesion layer and the reflective layer do not melt, and thus ensure the product quality of the display panel.

In some embodiments, removing the second substrate includes: thinning the second substrate using a mixed indicator, such that the thickness of the second substrate is less than or equal to 100 microns; and removing the thinned second substrate.

In some embodiments, the thinned second substrate is removed using a mixed solution including nitric acid, hydrofluoric acid, and acetic acid.

The method of fabricating a display substrate according to the embodiment of the present disclosure is further described below in connection with FIGS. 3A to 3E. In the embodiments of the present disclosure, a patterning process includes processes such as photoresist coating, exposure, development, etching, photoresist stripping, and the like.

Figure 3A:
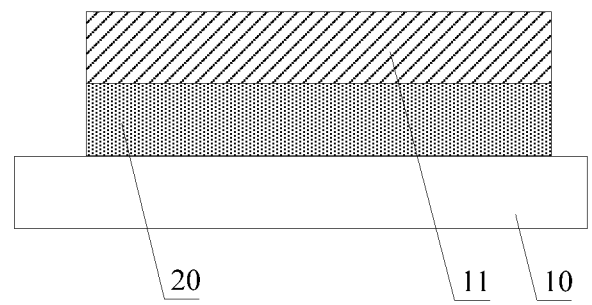
FIGS. 3A to 3G illustrate intermediate steps in a method of fabricating a display substrate according to an embodiment of the present disclosure.

As shown in FIG. 3A, a first substrate 10 is provided, and a thin film transistor 20 and an anode 11 are formed on the first substrate 10.

In some embodiments, the first substrate 10 is a transparent glass substrate or quartz substrate. The first substrate 10 may be cleaned before the thin film transistor 20 is formed.

In some embodiments, forming the thin film transistor 20 on the first substrate 10 includes: sequentially forming a gate electrode, a gate insulating layer, an active layer, an interlayer dielectric layer, source and drain electrodes and a passivation layer on the first substrate 10. In some embodiments, forming the thin film transistor 20 on the first substrate 10 includes: sequentially forming, on the first substrate 10, an active layer, a gate insulating layer, a gate electrode, an interlayer insulating layer, source and drain electrodes and a passivation layer.

In some embodiments, the gate electrode has a thickness of 200 nm, the gate insulating layer has a thickness of 150 nm, the active layer has a thickness of 40 nm, the source and drain electrodes have a thickness of 200 nm, and the passivation layer has a thickness of 300 nm.

In some embodiments, the anode 11 is connected to the drain electrode of the thin film transistor 20. In some embodiments, a first metal thin film and a second metal thin film are sequentially deposited on the thin film transistor, and the anode 11 is formed by a patterning process.

In some embodiments, the first metal thin film is made of Ti/Al/Ti and has a thickness of 400 nm.

In some embodiments, the second metal thin film is made of Au and has a thickness of 500 nm.

Figure 3B:
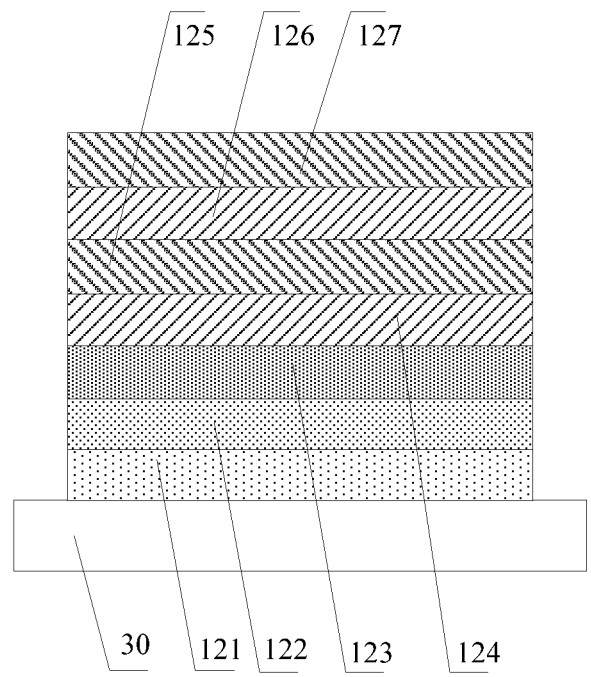

As shown in FIG. 3B, a second substrate 30 is provided, and a light-emitting layer is formed on the second substrate 30. In an embodiment, an N-type semiconductor layer 121, a multiple quantum well layer 122, a P-type semiconductor layer 123, an ohmic contact layer 124, a diffusion barrier layer 125, a reflective layer 126, and an adhesion layer 127 of the light-emitting layer are sequentially formed on the second substrate 30.

In some embodiments, the second substrate is a silicon substrate.

In some embodiments, before the N-type semiconductor layer is formed on the second substrate 30, the following processes need to be performed on the second substrate 30. The second substrate 30 is cleaned with sulfuric acid ($H_2SO_4$) and hydrogen peroxide ($H_2O_2$), then etched with 2% hydrofluoric acid solution for about 5 minutes, then washed with deionized water, then dried with nitrogen ($N_2$), and treated at a high temperature in a hydrogen ($H_2$) atmosphere to remove oxides on the surface of the silicon substrate, and then a buffer layer is formed on the second substrate.

In some embodiments, forming the buffer layer on the second substrate includes: placing the cleaned silicon substrate in an MOCVD reaction chamber, heating the MOCVD reaction chamber to 600 degrees Celsius and a pressure of 100 Torr, and at the same time, introducing trimethyl aluminum and nitrogen to allow for growth and reaction for 10 minutes on the silicon substrate to form gallium nitride having a thickness of 50 nm as the buffer layer.

It should be noted that the method of fabricating the display substrate according to the embodiments of the present disclosure may use hydrogen or nitrogen having high purity as a carrier gas, and use Trimethylgallium (TMGa), Triethylgallium (TEGa), Trimethylindium (TMIn), and ammonia (NH3) as a source of gallium, a source of indium and a source of nitrogen, respectively.

In some embodiments, the N-type semiconductor layer is a Si-doped GaN, for example, with silane as a dopant. The dopant is not limited in embodiments of the present disclosure, as long as the dopant includes the material of Si.

In some embodiments, the multiple quantum well layer is made of InGaN/GaN (indium gallium nitride/gallium nitride). The multiple quantum well layer made of InGaN/GaN has remarkable characteristics such as high efficiency, environmental protection, energy conservation, long life, and the like.

In some embodiments, the P-type semiconductor layer is Mg-doped GaN, for example, with magnesocene as a dopant. The dopant is not limited in embodiments of the present disclosure, as long as the dopant includes the material of Mg.

In some embodiments, the ohmic contact layer is made of Ni/Au with a thickness of 5 nm/5 nm, respectively.

In some embodiments, the diffusion barrier layer is used for avoiding current spreading, and the diffusion barrier layer is made of titanium (Ti) and has a thickness of 200 nm.

In some embodiments, the reflective layer is used for reflecting light, and the reflective layer is made of silver (Ag) and has a thickness of 200 nm.

In some embodiments, the adhesion layer is used for bonding the anode with the light-emitting layer, is made of indium or tin and has a thickness of 500 nm.

Figure 3C:
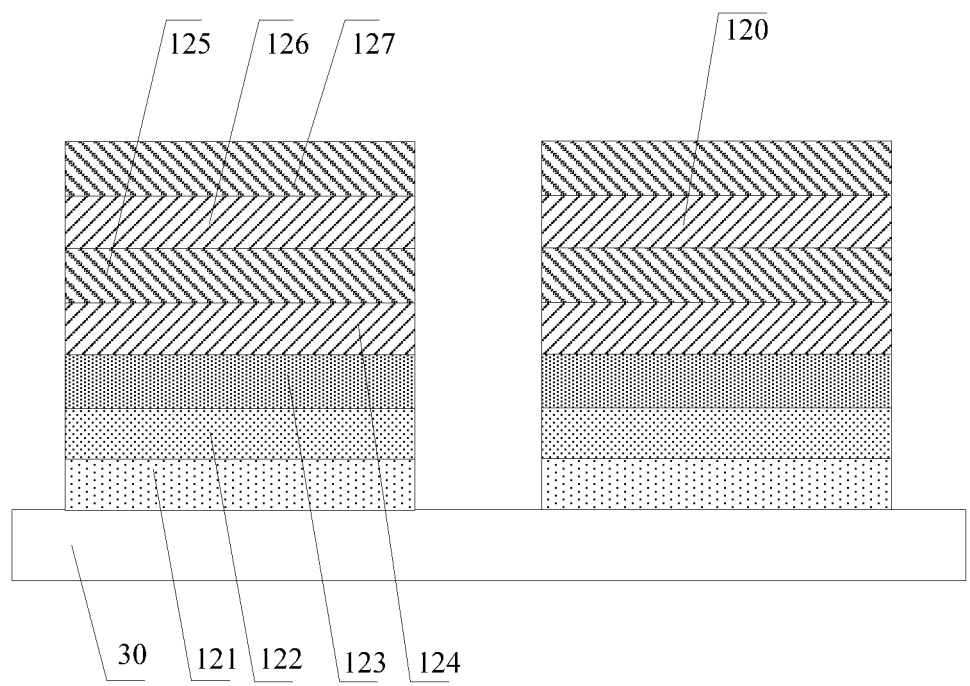

As shown in FIG. 3C, the light-emitting layer in each of the pixel regions is formed as a plurality of light-emitting units spaced apart from each other. In some embodiments, the light-emitting layer is split into the plurality of light-emitting units 120 by a coupled plasma etching process.

In some embodiments, the shape of the light-emitting unit may be a rectangle, which is not limited in the embodiments of the present disclosure.

Figure 3D:
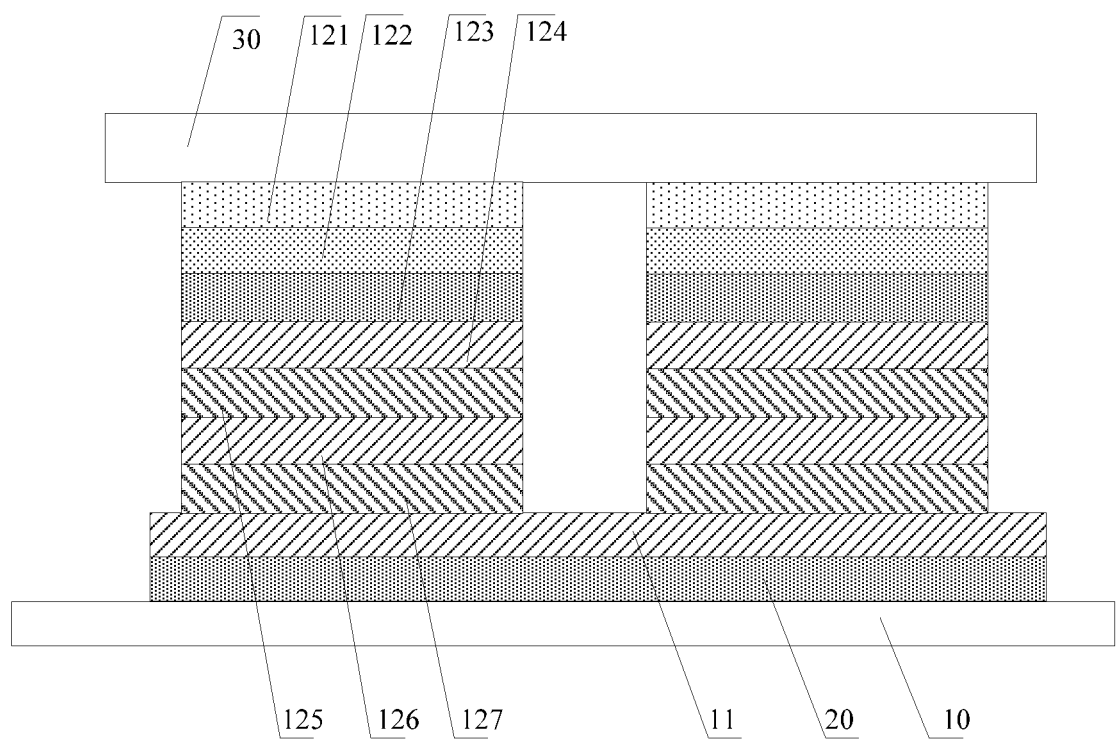

As shown in FIG. 3D, a side of the first substrate on which the anode is formed is bonded to a side of the second substrate on which the light-emitting layer is formed.

In some embodiments, the bonding is performed at a stress of 1 kN to 50 kN under a temperature lower than 300 degrees Celsius by using a flip chip bonding apparatus or a wafer bonding apparatus. The temperature for bonding may be selected according to the material of the adhesion layer. In the case where the adhesion layer is made of a conductive adhesive material, the bonding may be performed at a temperature below 210 degrees Celsius. In the case where the adhesion layer is made of a metal material, the bonding may be performed at a temperature of 190 to 300 degrees Celsius.

Figure 3E:
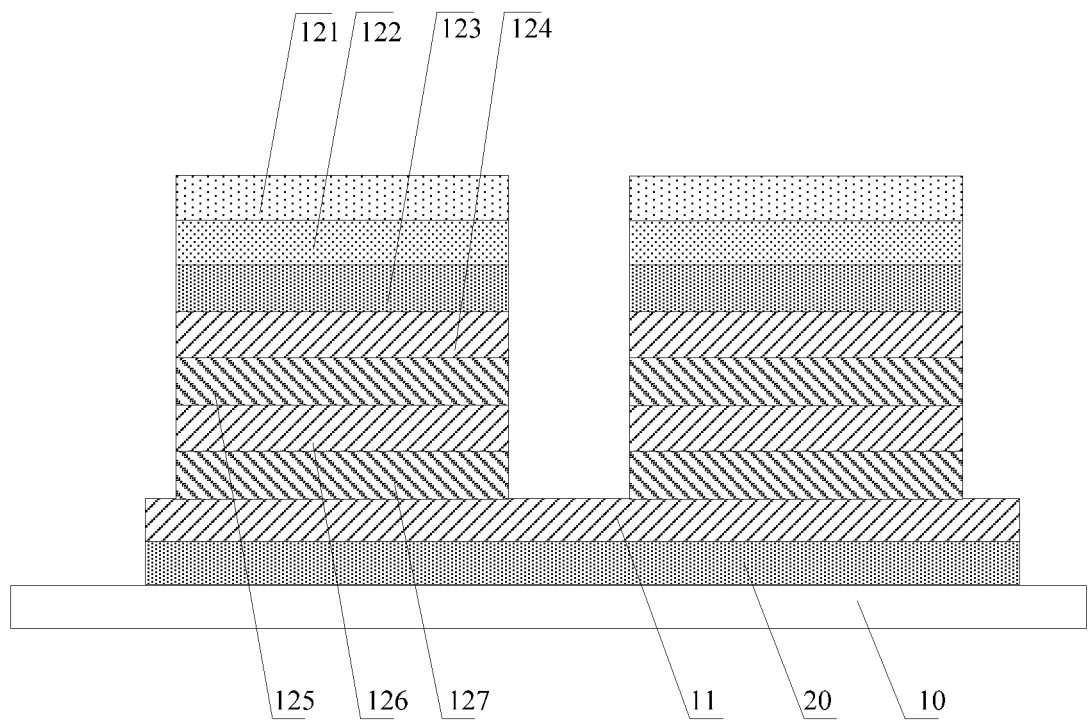

As shown in FIG. 3E, the second substrate 30 is removed. In some embodiments, the second substrate 30 is thinned to a thickness of less than 100 microns using a mixed indicator and is then removed.

Figure 3F:
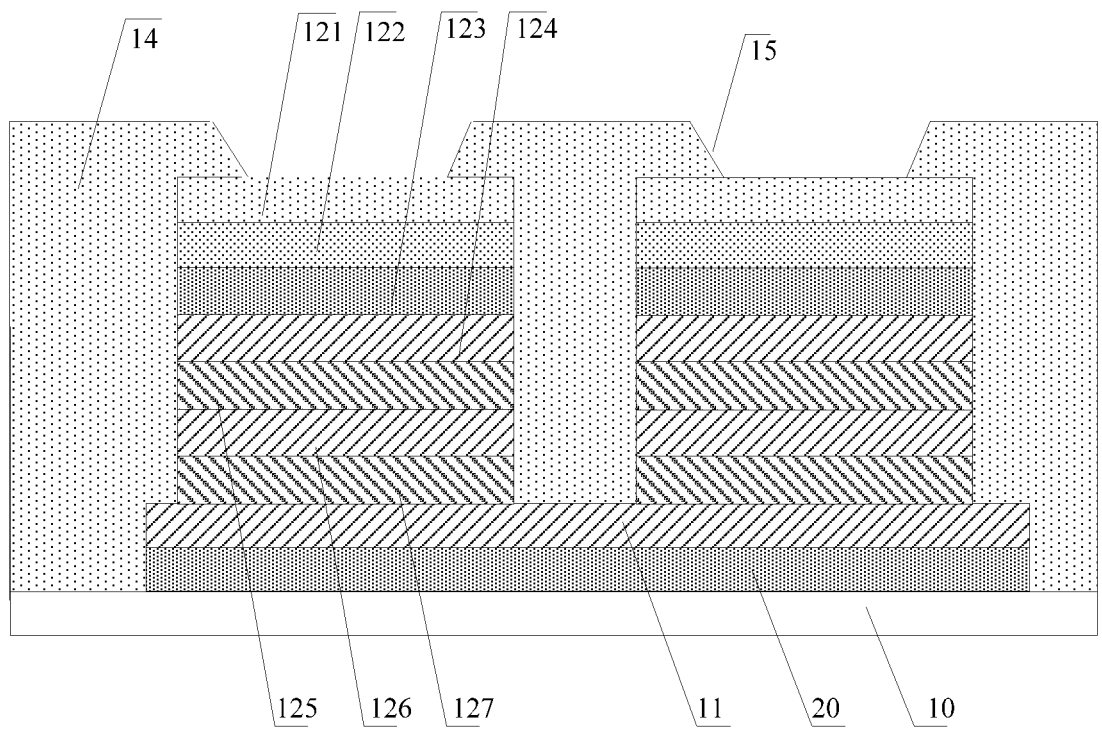

As shown in FIG. 3F, an insulating layer 14 is formed on a side of the light-emitting layer away from the first substrate 10 and between adjacent two light-emitting units. The insulating layer 14 includes a plurality of via holes 15. The insulating layer 14 is used as a mask to perform wet etching to remove the anode in the poorly-bonded region.

In some embodiments, the anode is etched by using an etchant. The etchant may be hydrochloric acid or other material that can be used to etch the anode, which is not limited in the embodiments of the present disclosure. In some embodiments, an orthographic projection of each via hole 15 on the first substrate 10 is within an orthographic projection of a corresponding light-emitting unit on the first substrate 10.

In some embodiments, the insulating layer is made of a photoresist, silicon oxide or silicon nitride, and the insulating layer has a thickness of 3 micron.

Figure 3G:
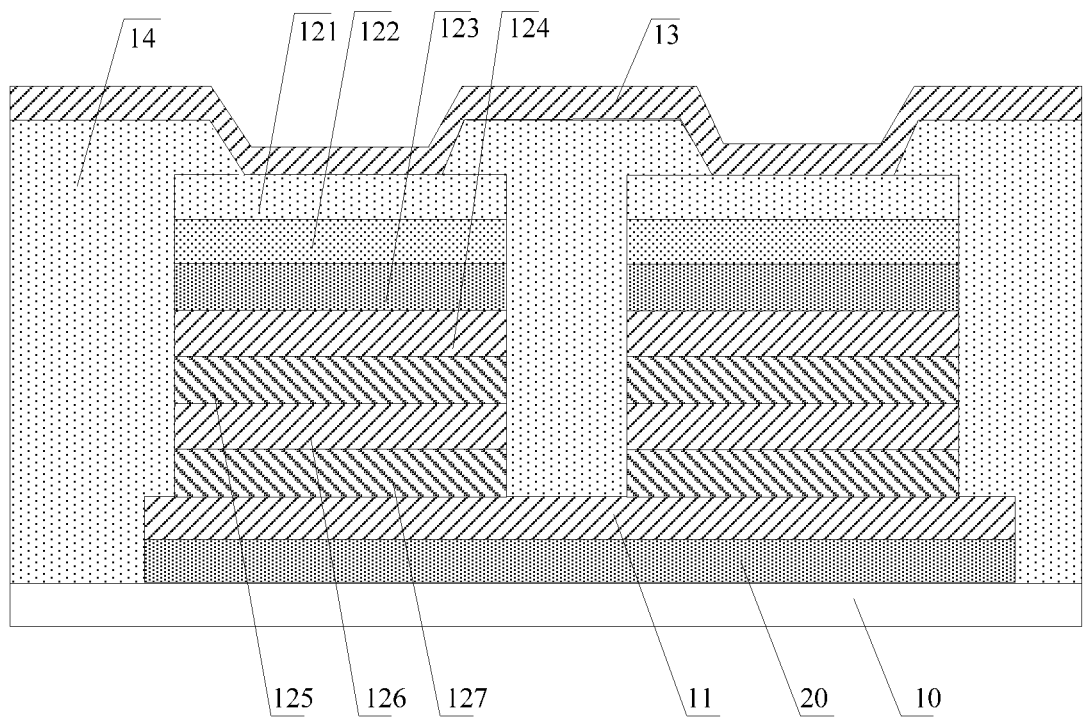

As shown in FIG. 3G, a cathode 13 is formed on a side of the insulating layer 14 away from the first substrate 10.

The cathode is connected to the light-emitting unit through the via hole 15 in the insulating layer 14.

Further, a color filter may be formed on a side of the cathode 13 away from the first substrate 10.

The color filter includes: red color filter, green color filter or blue color filter.

Figure 4:
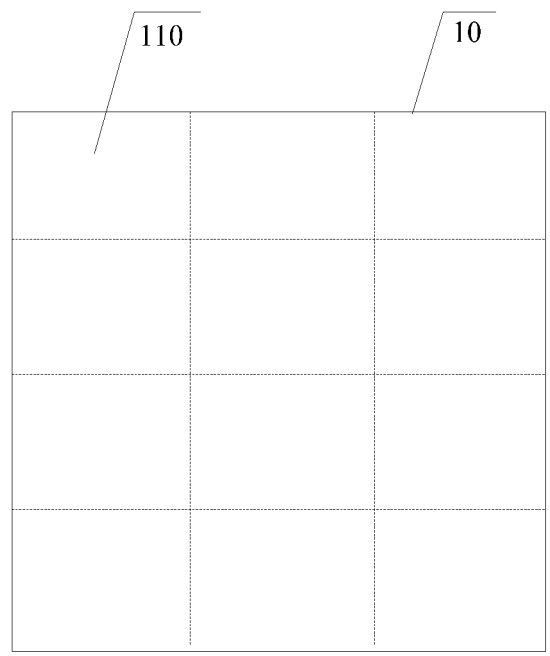
FIG. 4 is a plan view of a display substrate according to an embodiment of the present disclosure.
Figure 5:
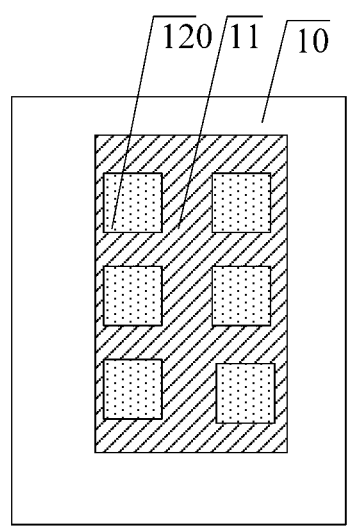
FIG. 5 is a plan view of one pixel region of a display substrate according to an embodiment of the present disclosure.
Figure 6:
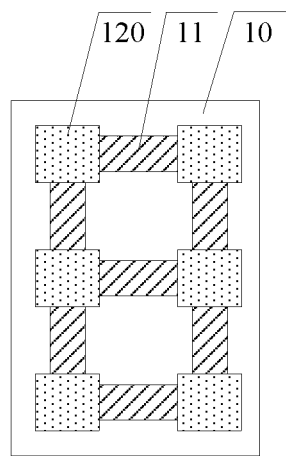
FIG. 6 is a plan view of one pixel region of a display substrate according to an embodiment of the present disclosure.
Figure 7:
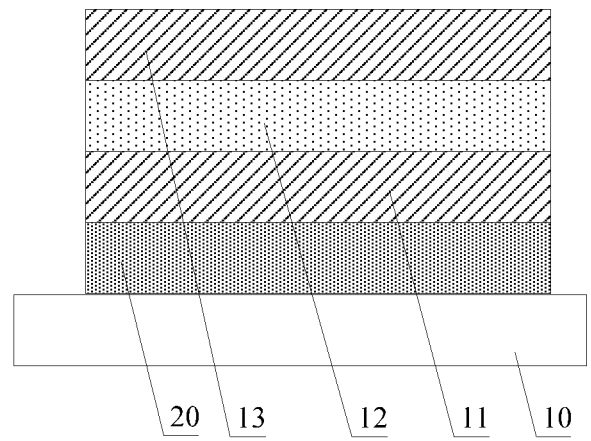
FIG. 7 is a side view of a display substrate according to an embodiment of the present disclosure.

FIG. 4 is a plan view of a display substrate according to an embodiment of the present disclosure. As shown in FIG. 4, the display substrate according to the embodiment of the present disclosure includes a plurality of pixel regions 110. FIG. 5 is a plan view of one pixel region of a display substrate according to an embodiment of the present disclosure, FIG. 6 is a plan view of one pixel region of a display substrate according to an embodiment of the present disclosure, and FIG. 7 is a side view of a display substrate according to an embodiment of the present disclosure. As shown in FIG. 4 to FIG. 7, the display substrate according to the embodiments of the present disclosure includes an anode 11, a light-emitting layer 12 and a cathode 13 in each pixel region 110.

In the embodiment, in each pixel region, the light-emitting layer 12 includes a plurality of light-emitting units 120 spaced apart from each other, both the anode and the cathode are conductive layers each having an integral structure, and the light-emitting units are respectively connected to the anode and the cathode.

In some embodiments, as shown in FIG. 7, the display substrate further includes a thin film transistor 20 disposed on the first substrate 10, and a drain electrode of the thin film transistor 20 is connected to the anode 11.

In some embodiments, the first substrate 10 is a transparent glass substrate or quartz substrate, which is not limited in the embodiments of the present disclosure.

In some embodiments, the shape of the light-emitting unit 120 may be a rectangle, which is not particularly limited in the embodiments of the present disclosure.

In some embodiments, the anode 11 is made of a metal or an alloy, and may have a single-layer structure or a multi-layer structure. For example, the anode may have a three-layer structure of titanium/aluminum/titanium (Ti/Al/Ti). The material and structure of the anode are not particularly limited in the embodiments of the present disclosure.

In some embodiments, the anode 11 has a thickness of 400 nm. The anode 11 has a mesh shape or a planar shape. It should be noted that, FIG. 5 illustrates an example in which the anode has a planar shape, FIG. 6 illustrates an example in which the anode has a mesh shape, and the embodiments of the present disclosure are not limited thereto.

In some embodiments, the cathode 13 is made of a metal or an alloy, and may have a single-layer structure or a multi-layer structure. The material and structure of the cathode are not particularly limited in the embodiments of the present disclosure. The cathode may have a mesh shape or a planar shape, which is not limited in the embodiments of the present disclosure.

The display substrate according to the embodiments of the present disclosure includes: an anode, a light-emitting layer, and a cathode disposed in each pixel region. In each pixel region, the light-emitting layer includes a plurality of light-emitting units spaced apart from each other, both the anode and the cathode are conductive layers each having an integral structure, and the light-emitting units are respectively connected to the anode and the cathode. In the display substrate according to the present disclosure, the light-emitting layer includes a plurality of light-emitting units spaced apart from each other, so that when the anode or the light-emitting layer corresponding to the sub-pixel is locally dirty or dusty, the well-bonded light-emitting units among the plurality of light-emitting units still emit light, thereby avoiding the problem that the entire sub-pixel is unlit due to the fact that the anode or the light-emitting layer corresponding to the sub-pixel is locally dirty or dusty, and thus improving the yield and display effect of the display panel.

Figure 8:
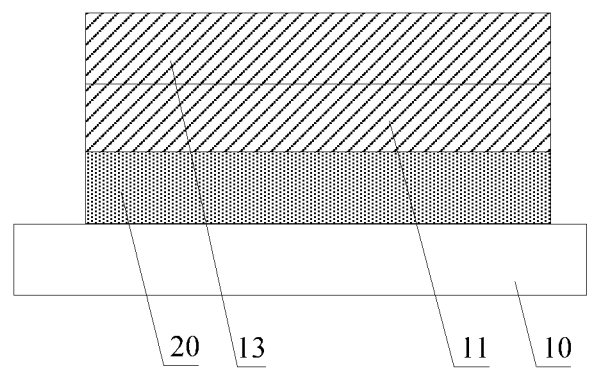
FIG. 8 is a side view of a display substrate in a poor bonding state according to an embodiment of the present disclosure.

Further, FIG. 8 is a side view of a display substrate in a poor bonding state according to an embodiment of the present disclosure. As shown in FIG. 8, in the display substrate according to the embodiment of the present disclosure, when the anode and the light-emitting layer are poorly bonded, the anode 11 and the cathode 13 are in direct contact with each other, causing a short circuit and affecting the display effect of the display substrate. In order to solve this technical problem, in the embodiments of the present disclosure, the anode corresponding to a poorly-bonded light-emitting unit is removed to avoid the short circuit between the anode and the cathode due to poor bonding between the anode and the light-emitting layer.

Figure 9:
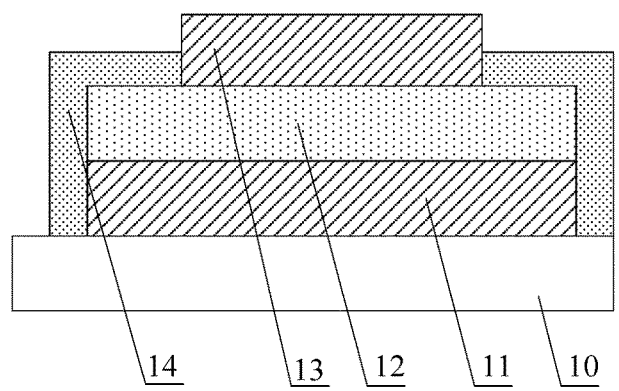
FIG. 9 is a side view of a display substrate according to an embodiment of the present disclosure.
Figure 10:
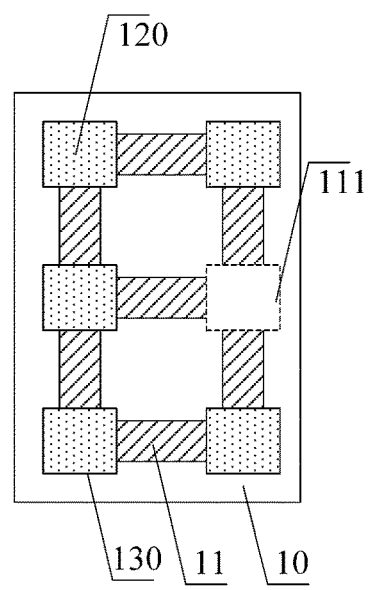
FIG. 10 is a plan view of one pixel region of a display substrate according to an embodiment of the present disclosure.

FIG. 9 is a side view of a display substrate according to an embodiment of the present disclosure, and FIG. 10 is a plan view of one pixel region of a display substrate according to an embodiment of the present disclosure. As shown in FIG. 9 and FIG. 10, the anode 11 includes a plurality of sub-electrodes 130 connected to each other. The display substrate according to the embodiment of the present disclosure further includes: an insulating layer 14 on a side of the light-emitting layer 12 away from the first substrate 10 and between adjacent two light-emitting units. The insulating layer 14 includes via holes 15 corresponding to the sub-electrodes 13. In an embodiment, an orthographic projection of the via hole on the first substrate may coincide with an orthographic projection of the sub-electrode on the first substrate.

In some embodiments, to protect the metal layer in the light-emitting unit from being etched, an orthographic projection of the light-emitting unit on the first substrate covers the orthographic projection of the via hole on the first substrate.

In some embodiments, the insulating layer 14 is made of silicon oxide, silicon nitride or a photoresist.

It should be noted that when the light-emitting layer 12 and the anode 11 are well bonded with each other, the light-emitting unit 120 and the insulating layer 14 are disposed between the cathode 13 and the anode 11 such that the cathode 13 and the anode 11 are not in contact with each other; as shown in FIG. 10, when the light-emitting layer 12 and the anode 11 are poorly bonded with each other, a target sub-electrode 111 of the anode 11 may be at least partially exposed by the light-emitting unit 120 and the insulating layer 14. In some embodiments, the target sub-electrode 111 may be a blank electrode.

It should be noted that the blank electrode means not including the conductive layer. FIG. 10 illustrates an example in which one of the sub-electrodes is the target sub-electrode. In some embodiments, the number of the target sub-electrodes is determined according to the dust on the anode and the light-emitting layer, and the number may be 0, or may be plural.

Figure 11:
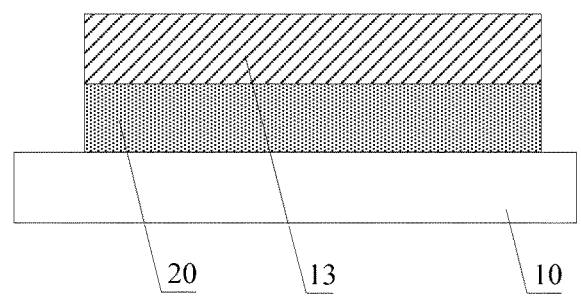
FIG. 11 is a side view of the display substrate shown in FIG. 10.

FIG. 11 is a side view of the display substrate shown in FIG. 10. As shown in FIG. 11, after the target sub-electrode is removed, the cathode 13 on the target sub-electrode directly corresponds to (e.g., is in contact with) the thin film transistor 20, thereby avoiding a short circuit caused by direct contact between the cathode and the anode.

In the present embodiment, by etching off the sub-electrodes corresponding to the poorly-bonded light-emitting units, the technical problem of defect of the entire sub-pixel due to the short circuit between the cathode and the anode caused by poor bonding between the anode and the light-emitting layer can be avoided.

Figure 12:
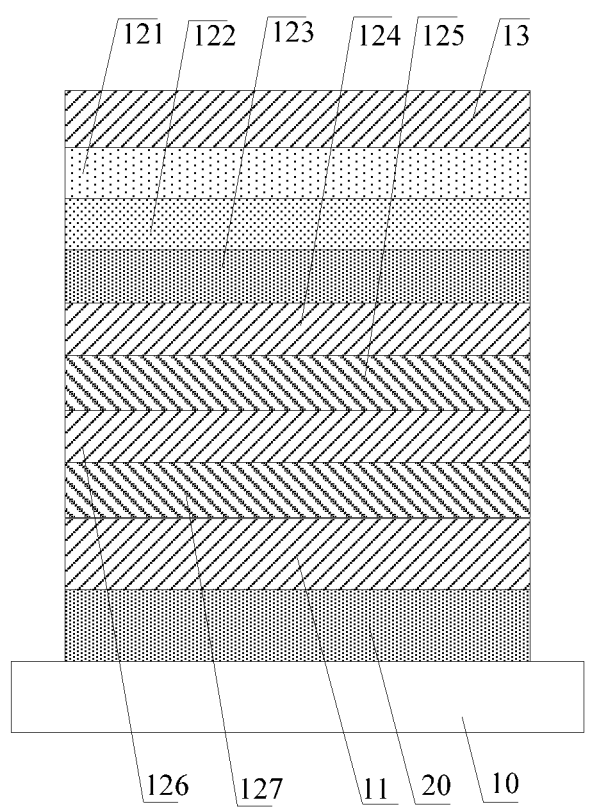
FIG. 12 is a side view of a display substrate according to an embodiment of the present disclosure.

FIG. 12 is a side view of a display substrate according to an embodiment of the present disclosure. As shown in FIG. 12, a light-emitting unit in a display substrate according to the embodiment of the present disclosure includes: an N-type semiconductor layer 121, a multiple quantum well layer 122, a P-type semiconductor layer 123, and a metal layer; the metal layer includes: an ohmic contact layer 124, a diffusion barrier layer 125, a reflective layer 126, and an adhesion layer 127.

In some embodiments, the adhesion layer 127 is disposed on a side of the anode 11 away from the first substrate 10; the reflective layer 126 is disposed on a side of the adhesion layer 127 away from the first substrate 10; the diffusion barrier layer 125 is disposed on a side of the reflective layer 126 away from the first substrate 10; the ohmic contact layer 124 is disposed on a side of the diffusion barrier layer 125 away from the first substrate 10; the P-type semiconductor layer 123 is disposed on a side of the metal layer away from the first substrate 10; the multiple quantum well layer 122 is disposed on a side of the P-type semiconductor layer 123 away from the first substrate 10; and the N-type semiconductor layer 121 is disposed on a side of the multiple quantum well layer 122 away from the first substrate 10.

In some embodiments, the N-type semiconductor layer is a Si-doped GaN, for example, with silane as a dopant. The dopant is not limited in embodiments of the present disclosure, as long as the dopant includes the material of Si.

In some embodiments, the multiple quantum well layer is made of InGaN/GaN (indium gallium nitride/gallium nitride). The multiple quantum well layer made of InGaN/GaN has remarkable characteristics such as high efficiency, environmental protection, energy conservation, long life, and the like.

In some embodiments, the P-type semiconductor layer is Mg-doped GaN, for example, with magnesocene as a dopant. The dopant is not limited in embodiments of the present disclosure, as long as the dopant includes the material of Mg.

In some embodiments, the ohmic contact layer is used for absorbing light, is made of nickel/gold (Ni/Au) with a thickness of 5 nm/5 nm, respectively.

In some embodiments, the diffusion barrier layer is used for avoiding current spreading, is made of titanium (Ti) and has a thickness of 200 nm, and the embodiments of the present disclosure are not limited thereto.

In some embodiments, the reflective layer is used for reflecting light, is made of silver (Ag) and has a thickness of 200 nm, and the embodiments of the present disclosure are not limited thereto.

In some embodiments, the adhesion layer is used for bonding the anode with the light-emitting layer and increasing the bonding force between the light-emitting layer and the anode, is made of indium or tin and has a thickness of 500 nm, and the embodiments of the present disclosure are not limited thereto.

In another aspect, the embodiments of the present disclosure further provide a display panel including a display substrate according to the embodiments of the present disclosure.

The display panel according to the embodiments of the present disclosure includes the above-described display substrate, and the implementation principle and effect thereof are similar to those of the above-described display substrate, and details are not described here again.

In another aspect, the embodiments of the present disclosure further provide a display device including: a display panel according to the embodiments of the present disclosure.

In some embodiments, the display device may be any product or component having a display function such as an electronic paper, an OLED panel, a mobile phone, a tablet, a television, a display, a notebook computer, a digital photo frame, or a navigator.

The drawings of the present disclosure relate only to the structures involved in the embodiments of the present disclosure, and for other structures, reference may be made to the general design.

For the sake of clarity, the thickness and size of the layers or microstructures are exaggerated in the drawings used to describe the embodiments of the present disclosure. It will be understood that when an element such as a layer, a film, a region or a substrate is described as being "on" or "under" another element, the element may be "directly on" or "directly under" the other element, or there may be an intermediate element.

In the case of no conflict, the embodiments of the present disclosure and the features in the embodiments may be combined with each other to obtain a new embodiment.

The embodiments disclosed in the present disclosure are as described above, but are merely used to facilitate the understanding of the present disclosure, rather than to limit the present disclosure. Any modification and variation in the form and details of the implementation may be made by those skilled in the art without departing from the spirit and scope of the disclosure, but the scope of the disclosure is defined by the appended claims.

The invention claimed is:

1. A method of fabricating a display substrate, the display substrate having a plurality of pixel regions, the method comprising:
   providing a first substrate; and
   forming, in each pixel region, an anode, a light-emitting layer and a cathode on the first substrate,
   wherein in at least one pixel region, the light-emitting layer comprises a plurality of light-emitting units spaced apart from each other, both the anode and the cathode are conductive layers each having an integral structure, and the plurality of light-emitting units are connected to the anode and the cathode, respectively.

2. The method of claim 1, wherein forming, in each pixel region, the anode, the light-emitting layer and the cathode on the first substrate comprises:
   forming the anode on the first substrate;
   forming the light-emitting layer on the second substrate;
   forming the light-emitting layer in at least one pixel region into the plurality of light-emitting units spaced apart from each other;
   bonding a side of the first substrate on which the anode is formed to a side of the second substrate on which the light-emitting layer is formed;
   removing the second substrate; and
   forming the cathode on a side of the light-emitting layer away from the first substrate.

3. The method of claim 2, further comprising, prior to forming the cathode on the side of the light-emitting layer away from the first substrate,
   forming an insulating layer on the side of the light-emitting layer away from the first substrate, wherein the insulating layer comprises a via hole, and the cathode is connected to the light-emitting unit through the via hole; and
   performing wet etching by using the insulating layer as a mask, to remove the anode in a poorly-bonded region.

4. The method of claim 2, wherein forming the light-emitting layer in at least one pixel region into the plurality of light-emitting units spaced apart from each other comprises splitting the light-emitting layer into the plurality of light-emitting units spaced apart from each other by a coupled plasma etching process.

5. The method of claim 2, wherein forming the light-emitting layer on the second substrate comprises:
   forming a second conductivity type semiconductor layer on the second substrate;
   forming a multiple quantum well layer on a side of the second conductivity type semiconductor layer away from the second substrate;
   forming a first conductivity type semiconductor layer on a side of the multiple quantum well layer away from the second substrate;
   forming an ohmic contact layer on a side of the first conductivity type semiconductor layer away from the second substrate;
   forming a diffusion barrier layer on a side of the ohmic contact layer away from the second substrate;
   forming a reflective layer on a side of the diffusion barrier layer away from the second substrate; and
   forming an adhesion layer on a side of the reflective layer away from the second substrate.

6. The method of claim 2, wherein bonding the side of the first substrate on which the anode is formed to the side of the second substrate on which the light-emitting layer is formed comprises:
   by using one of a flip chip bonding apparatus or a wafer bonding apparatus, bonding, at a stress of 1 kN to 50 kN, the side of the first substrate on which the anode is formed to the side of the second substrate on which the light-emitting layer is formed, under a temperature lower than 300 degrees Celsius.

7. The method of claim 2, wherein removing the second substrate comprises:
   thinning the second substrate using a mixed indicator, such that a thickness of the second substrate is less than or equal to 100 microns; and
   removing the thinned second substrate.

8. The method of claim 2, further comprising, prior to forming the anode on the first substrate, forming a thin film transistor on the first substrate.

9. The method of claim 2, further comprising, subsequent to forming the cathode, forming a color filter on a side of the cathode away from the first substrate.

10. A display substrate having a plurality of pixel regions, the display substrate comprising an anode, a light-emitting layer and a cathode in each pixel region,
    wherein in at least one pixel region, the light-emitting layer comprises a plurality of light-emitting units spaced apart from each other, both the anode and the cathode are conductive layers each having an integral structure, and the plurality of light-emitting units are connected to the anode and the cathode, respectively.

11. The display substrate of claim 10, further comprising:
    a substrate, wherein the anode, the light-emitting layer and the cathode are sequentially on the substrate; and
    an insulating layer on a side of the light-emitting layer away from the anode;
    wherein the cathode is on a side of the insulating layer away from the light-emitting layer, and the cathode is connected to the light emitting unit through a via hole in the insulating layer.

12. The display substrate of claim 11, wherein an orthographic projection of the via hole on the substrate is within an orthographic projection of a corresponding light-emitting unit on the substrate.

13. The display substrate of claim 11, wherein the insulating layer is made of silicon oxide, silicon nitride or a photoresist.

14. The display substrate of claim 11, wherein the light-emitting unit comprises: a metal layer, a first conductivity type semiconductor layer, a multiple quantum well layer and a second conductivity type semiconductor layer;
the metal layer is on a side of the anode away from the substrate;
the first conductivity type semiconductor layer is on a side of the metal layer away from the anode;
the multiple quantum well layer is on a side of the first conductivity type semiconductor layer away from the metal layer; and
the second conductivity type semiconductor layer is on a side of the multiple quantum well layer away from the first conductivity type semiconductor layer.

15. The display substrate of claim 14, wherein the metal layer comprises: an ohmic contact layer, a diffusion barrier layer, a reflective layer, and an adhesion layer;
the adhesion layer is on a side of the anode away from the substrate;
the reflective layer is on a side of the adhesion layer away from the anode;
the diffusion barrier layer is on a side of the reflective layer away from the adhesion layer; and
the ohmic contact layer is on a side of the diffusion barrier layer away from the reflective layer.

16. The display substrate of claim 10, wherein a shape of the anode is one of a mesh shape or a planar shape.

17. The display substrate of claim 10, wherein a shape of the cathode is one of a mesh shape or a planar shape.

18. The display substrate of claim 11, further comprising a thin film transistor between the substrate and the anode.

19. A display panel comprising a display substrate, wherein the display substrate is the display substrate of claim 10.

20. A display device comprising a display panel, wherein the display panel is the display panel of claim 19.

* * * * *